(12) United States Patent
Kozlov

(10) Patent No.: US 7,656,707 B2
(45) Date of Patent: Feb. 2, 2010

(54) SYSTEMS AND METHODS FOR DISCRETE CHANNEL DECODING OF LDPC CODES FOR FLASH MEMORY

(75) Inventor: Alexander Kozlov, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 12/002,020

(22) Filed: Dec. 14, 2007

(65) Prior Publication Data
US 2009/0154236 A1 Jun. 18, 2009

(51) Int. Cl.
G11C 16/04 (2006.01)

(52) U.S. Cl. .............. 365/185.05; 365/185.25; 365/154; 365/156

(58) Field of Classification Search ............ 365/185.03, 365/185.28, 154, 156
See application file for complete search history.

(56) References Cited

U.S. PATENT DOCUMENTS 7,388,781 B2 * 6/2008 Litsyn et al. ............ 365/185.09
2007/0237006 A1 * 10/2007 Murin et al. ........... 365/189.01

* cited by examiner

Primary Examiner—Hoai V Ho
Assistant Examiner—Jason Lappas
(74) Attorney, Agent, or Firm—Schubert Osterrieder & Nickelson PLLC; Jeffrey S. Schubert

(57) ABSTRACT

Embodiments include systems and methods for soft encoding and decoding of data for flash memories using Log-Likelihood Ratios (LLRs). The LLRs are computed from statistics determined by observation of flash memory over time. In some embodiments, the write, retention and read transition probabilities are computed based on the observed statistics. These probabilities are used to compute the LLRs. During a read operation, a device reads the voltage of a cell of the flash memory. The level of the output is determined from the voltage. The level determines which LLRs to compute and transmit to a soft decoder.

11 Claims, 2 Drawing Sheets

SYSTEMS AND METHODS FOR DISCRETE CHANNEL DECODING OF LDPC CODES FOR FLASH MEMORY

FIELD

This written description is in the field of multi-level cell (MLC) flash memories. More particularly, the description is in the field of discrete channel decoding of flash memory contents.

BACKGROUND

Flash memory is non-volatile computer memory that can be electrically erased and reprogrammed. It is a technology that is primarily used in memory cards, and Universal Serial Bus (USB) flash drives (e.g., thumb drive, handy drive, memory stick, flash stick, jump drive) for general storage and transfer of data between computers and other digital products. It is a specific type of Electrically Erasable Programmable Read Only Memory (EEPROM) that is erased and programmed in large blocks. Flash memory costs far less than byte-programmable EEPROM and therefore has become the dominant technology wherever a significant amount of non-volatile, solid-state storage is needed. Examples of applications include Personal Digital Assistants (PDAs) and laptop computers, digital audio players, digital cameras and mobile phones.

Flash memory is non-volatile, which means that it does not need power to maintain the information stored in the chip. In addition, flash memory offers fast read access times (although not as fast as volatile direct Random Access Memory (DRAM) used for main memory in PCs) and better kinetic shock resistance than hard disks. These characteristics explain the popularity of flash memory for applications such as storage on battery-powered devices. Another feature of flash memory is that when packaged in a "memory card", it is enormously durable, being able to withstand intense pressure, extremes of temperature and immersion in water.

Flash memory stores information in an array of floating-gate transistors, called "cells". In traditional single-level cell (SLC) devices, each cell stores only one bit of information. However, newer flash memory, known as multi-level cell (MLC) devices, can store more than one bit per cell by choosing between multiple levels of electrical charge to apply to the floating gates of its cells.

DETAILED DESCRIPTION OF EMBODIMENTS

Figure 1:
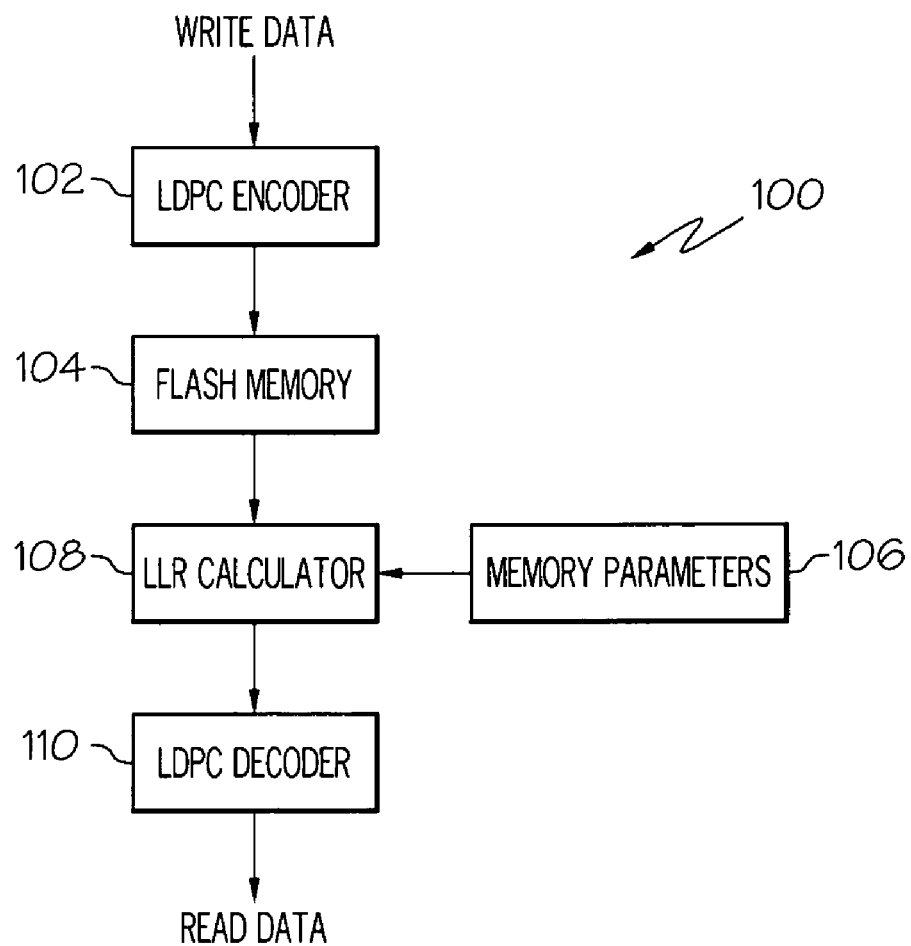
FIG. 1 depicts an embodiment of a flash memory system with an LLR calculator for computing Log Likelihood Rations.

The following is a detailed description of embodiments of the invention depicted in the accompanying drawings. The embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Embodiments include systems and methods for soft encoding and decoding of data for flash memories using Log-Likelihood Ratios (LLRs). The LLRs are computed from statistics determined by observation of flash memory over time. In some embodiments, the write, retention and read transition probabilities are computed based on the observed statistics. These probabilities are used to compute the LLRs. During a read operation, a device reads the voltage of a cell of the flash memory. The level of the output is determined from the voltage. The level determines which LLRs to compute and transmit to a soft decoder.

It is known that flash memory exhibits errors. One therefore wishes to encode the data to be written to the memory in such a way as to maximize the probability that after any amount of retention time, the data that is read is the same as the data that was written. When the write data is encoded, the encoded data that is actually written must be decoded when the data is read. There are hard decoders and soft decoders. With hard decoding, the voltage level detected during a read operation determines whether the data read is a (0,0), (0,1), (1,0), (1,1) (in a 4 flash memory). These hard bits are fed to the hard decoder which determines the read data sent to the reading device. In soft decoding, the values determined from a read of memory are statistical in nature. The performance of hard decoding is not as good as the performance of soft decoding such as Low Density Parity Check (LDPC) decoding. One therefore desires to use soft decoding such as LDPC. LDPC coding is relatively simple, has minimal redundancy and minimal decoder complexity. However, to implement LDPC decoding, one needs soft values. Soft values are values corresponding to the level of the voltage read from the cell that depend upon the error statistics of the memory. Soft values depend upon a priori knowledge of the statistics of the write, retention, and read operations on the memory. Thus, embodiments described herein provide soft values based on observed statistics of the flash memory.

In multilevel cell (MLC) Flash memories, issues such as disturbances during write/read and retention become critical for memory reliability. In MLC single Flash memory, a floating gate transistor stores two bits of information using four levels of threshold voltage. However usage of higher order modulation leads to more unpredictable programming, and less reliable retention and reading. Low Density Parity Check (LDPC) codes have good decoding performance using probabilistic decoders. Unfortunately in Flash memory devices it is impractical to get soft channel output for such decoders. Embodiments described herein provide a method for setting up bit reliabilities that can be used for LDPC probabilistic decoders using transition probabilities between threshold voltage levels.

Overall memory operation can be divided into three parts: write errors, retention errors and read errors. Write errors can be described using the following probability transition matrix:

$$WR = \begin{pmatrix} \approx 1 & W_{wr} & W_{wr}\exp\left(\frac{\beta(\delta_0 + \delta_1)}{2}\right) & W_{wr}\exp\left(\frac{\beta(\delta_0 + 2\delta_1 + \delta_2)}{2}\right) + Z_{wr} \\ \approx 0 & \approx 1 & X_{wr} & X_{wr}\exp\left(\frac{\beta(\delta_0 + \delta_1)}{2}\right) + Z_{wr} \\ \approx 0 & \approx 0 & \approx 1 & Y_{wr} + Z_{wr} \\ \approx 0 & \approx 0 & \approx 0 & \approx 1 \end{pmatrix}$$

where $X_{wr}$, $W_{wr}$, $Y_{wr}$, $Z_{wr} \propto$ cycles, $Z_{wr}=1-(1-p)^s$, and $p \propto$ cycles, and cycles is the number of program/erase cycles, S is memory string size, $\beta$ is a slope factor, and $\delta_i$ is the difference between mean threshold voltages of the levels. The terms in the matrix are determined from observing actual flash memory in operation and determining transition probabilities from these observations. Note that it has been observed that the threshold voltages have Gaussian like distributions with a tail. The transition probabilities therefore may be expressed in terms of exponentials. The terms can be stored in memory. As will be shown, the terms of the matrix are used to compute Log Likelihood Ratios that are transmitted to a decoder, which in one embodiment is an LDPC decoder.

Retention errors can be described using the following probability transition matrix:

$$RET = \begin{pmatrix} \approx 1 & \approx 0 & \approx 0 & \approx 0 \\ \approx X_{ret}\exp\left(\frac{\beta(\delta_0 + 2\delta_1 + \delta_2)}{2}\right) & \approx 1 & \approx 0 & \approx 0 \\ \approx X_{ret}\exp\left(\frac{\beta(\delta_0 + 2\delta_1 + \delta_2)}{2}\right) & \approx X_{ret}\exp\left(\frac{\beta(\delta_1 + \delta_2)}{2}\right) & \approx 1 & \approx 0 \\ \approx X_{ret}\exp\left(\frac{\beta(\delta_0 + 2\delta_1 + \delta_2)}{2}\right) & \approx X_{ret}\exp\left(\frac{\beta(\delta_1 + \delta_2)}{2}\right) & \approx X_{ret} & \approx 1 \end{pmatrix}$$

where $X_{ret} \propto \text{cycles} \times \text{time}^\alpha$, cycles is the number of program/erase cycles, time—retention time in hours. $\alpha$ is an acceleration factor. The terms of this matrix are determined from observing actual flash memory in operation and determining transition probabilities from these observations.

Read errors can be described using the following probability transition matrix:

$$RD = \begin{pmatrix} \approx 1 & X_{rd} & X_{rd}\exp\left(\frac{\beta(\delta_0 + \delta_1)}{2}\right) & X_{rd}\exp\left(\frac{\beta(\delta_0 + 2\delta_1 + \delta_2)}{2}\right) \\ \approx 0 & \approx 1 & X_{rd}\exp\left(\frac{\beta(\delta_0 + \delta_1)}{2}\right) & X_{rd}\exp\left(\frac{\beta(\delta_0 + 2\delta_1 + \delta_2)}{2}\right) \\ \approx 0 & \approx 0 & \approx 1 & X_{rd}\exp\left(\frac{\beta(\delta_0 + 2\delta_1 + \delta_2)}{2}\right) \\ \approx 0 & \approx 0 & \approx 0 & \approx 1 \end{pmatrix}$$

where $X_{rd} \propto \text{cycles} \times \text{nreads}^\gamma$, cycles is the number of program/erase cycles, nreads is the number of extensive reads, and $\gamma$ is an acceleration factor. The terms of this matrix are determined from observing actual flash memory in operation and determining transition probabilities from these observations.

To derive memory cell bit log-likelihood ratios we need to obtain the probability transition matrix between levels after a full memory operation cycle (write, retention and read). That matrix is the product of the matrices given above:

$$P = WR * RET * RD$$

Thus, the write, retention, and read operations is analogous to data passing through a channel that introduces errors. The channel has statistics associated therewith. One desires to learn from these statistics and use them to determine Log Likelihood Ratios for input to a soft decoder. So using the channel matrix P we compute log-likelihood ratios and simplify them by neglecting probability terms with order larger than one. To simplify the terms, we define three constants as follows:

$$K_1 = \exp\left(\frac{\beta(\delta_0 + 2\delta_1 + \delta_2)}{2}\right)$$

$$K_2 = \exp\left(\frac{\beta(\delta_0 + \delta_1)}{2}\right)$$

$$K_3 = \exp\left(\frac{\beta(\delta_1 + \delta_2)}{2}\right)$$

These constants are used to compute the Log Likelihood Ratios (LLRs):

$$LLR_{msbL0} = \log\left(\frac{K_1 X_{ret} + 1}{2K_1 X_{ret}}\right); \quad LLR_{lsbL0} = \log\left(\frac{K_1 X_{ret} + 1}{2K_1 X_{ret}}\right);$$

$$LLR_{msbL1} = \log\left(\frac{K_1 X_{ret} + W_{wr} + X_{rd}}{K_3 X_{ret} + 1}\right); \quad LLR_{lsbL1} = \log\left(\frac{W_{wr} + X_{rd} + 1}{2K_3 X_{ret}}\right);$$

$$LLR_{msbL2} = \log\left(\frac{K_2 X_{rd} + X_{ret}}{K_2 X_{rd} + W_{wr} + 1}\right); \quad LLR_{lsbL2} = \log\left(\frac{K_2 X_{rd} + W_{wr} + X_{rd}}{X_{ret} + 1}\right);$$

$$LLR_{msbL3} = \log\left(\frac{K_1(W_{wr} + X_{rd}) + Z_{wr} + 1}{K_3 X_{wr} + 2K_1 X_{rd} + 2Z_{wr} + Y_{wr}}\right);$$

$$LLR_{lsbL3} = \log\left(\frac{K_1(W_{wr} + 2X_{rd}) + K_3 X_{wr} + 2Z_{wr}}{K_1 X_{rd} + Z_{wr} + Y_{wr} + 1}\right);$$

where $LLR_{msbL_i}$ and $LLR_{lsbL_i}$ are reliabilities of the level $L_i$ of most and least significant bits respectively. The use of these LLRs to enable soft coding and decoding will be hereafter described.

FIG. 1 shows a block diagram of an embodiment for using calculated bit reliabilities to determine what has been stored in a cell of a flash memory. The block diagram shows flash memory modeled as a channel phenomena. Hence, input data (that is, data to be stored in the memory) is first encoded using an LDPC Encoder 102. The purpose of the LDPC encoder is to encode the input data so that the probability of the data being accurately recovered by a read operation is maximized. Thus, the LDPC code introduces redundancy in the data in such a way as to optimize the probability of recovering the correct data during a read operation. The encoded data is written to the flash memory 104 where it is retained for some period of time. Flash memory may be used to retain data for long periods of time. At some point in time after the data was stored, the data is read from the flash memory and is input to an LLR calculator 108. Note that during writing and during retention and during reading, errors can occur which can be described by the above-given transition probability terms that are included in the Log Likelihood Ratios.

LLR calculator 108, calculates the reliabilities given above based on memory parameters 106 which may include the number of program/erase cycles, the number of read operations, and retention time. LLR calculator 108 receives the data read from flash memory 104 and at first makes a hard decision what level of voltage is received. For example, if the voltage read is at level 0, this corresponds to (1,1). If the voltage read is at level 1, this corresponds to (0,1). If the voltage read is at level 2, this corresponds to (0,0). If the voltage read is at level 3, this corresponds to (1,0).

But rather than transmitting these hard bit values, the LLR calculator 108 transmits, instead, the above-given bit reliabilities. Thus, for a hard decision that level 0 is read, LLR calculator 108 transmits ($LLR_{msbL_0}$, $LLR_{lsb_0}$) to the LDPC decoder 110 instead of (1,1). For a hard decision that level 1 is read, LLR calculator 108 transmits ($LLR_{msbL_1}$, $LLR_{lsbL_1}$) to LDPC decoder 110 instead of (0,1). For a hard decision that level 2 is read, LLR calculator 108 transmits ($LLR_{msbL_2}$, $LLR_{msbL_2}$) to LDPC decoder 110 instead of (0,0). For a hard decision that level 3 is read, LLR calculator 108 transmits ($LLR_{msbL_3}$, $LLR_{msbL_3}$) to LDPC decoder 110 instead of (1,0). This is shown in the following table.

| Voltage Level | Corresponding Bit Values | Log Likelihood Ratios |
|---|---|---|
| 0 | 1, 1 | ($LLR_{msbL_0}$, $LLR_{lsbL_0}$) |
| 1 | 0, 1 | ($LLR_{msbL_1}$, $LLR_{lsbL_1}$) |
| 2 | 0, 0 | ($LLR_{msbL_2}$, $LLR_{lsbL_2}$) |
| 3 | 1, 0 | ($LLR_{msbL_3}$, $LLR_{lsbL_3}$) | where the LLRs are calculated or read from a memory.

The above-given bit reliabilities (LLRs) are herein called soft values. Outputting soft values that depend upon the statistics of the memory process (i.e., number of program/erase cycles, number of reads, retention time) enables use of LDPC coding which provides very good performance with minimal redundancy and minimal decoder complexity. Other coding schemes that benefit from the use of soft values could be employed in other embodiments. Thus, the LLRs output by the LLR calculator, are used by the LDPC decoder to determine the read data. The output of LDPC decoder 110 is the output data to be sent to the device that requested the read operation. Ideally, the output data (read data) is identical to the input data (write data).

Thus, one embodiment is a multi-level cell flash memory system for writing, storing and reading data. The embodiment comprises an encoder to encode data received for writing to the memory. A flash memory receives data from the encoder and stores data and makes data available to be read by an external device. A cell of the flash memory outputs a voltage level that is interpreted by an LLR calculator to be the closest one of four voltage levels of the cell. A Log-Likelihood Ratio (LLR) calculator outputs a calculated LLR value of each bit of the most and least significant bits corresponding to the interpreted voltage level. A decoder decodes the LLR values received from the calculator to determine read values of the memory system. In one embodiment, the encoder and decoder implement Low Density Parity Check (LDPC) coding. In some embodiments, the LLR calculator outputs LLR values based on the interpreted level, a number of program/erase cycles of the memory, a number of read operations of the memory, and a retention time of the data.

Figure 2:
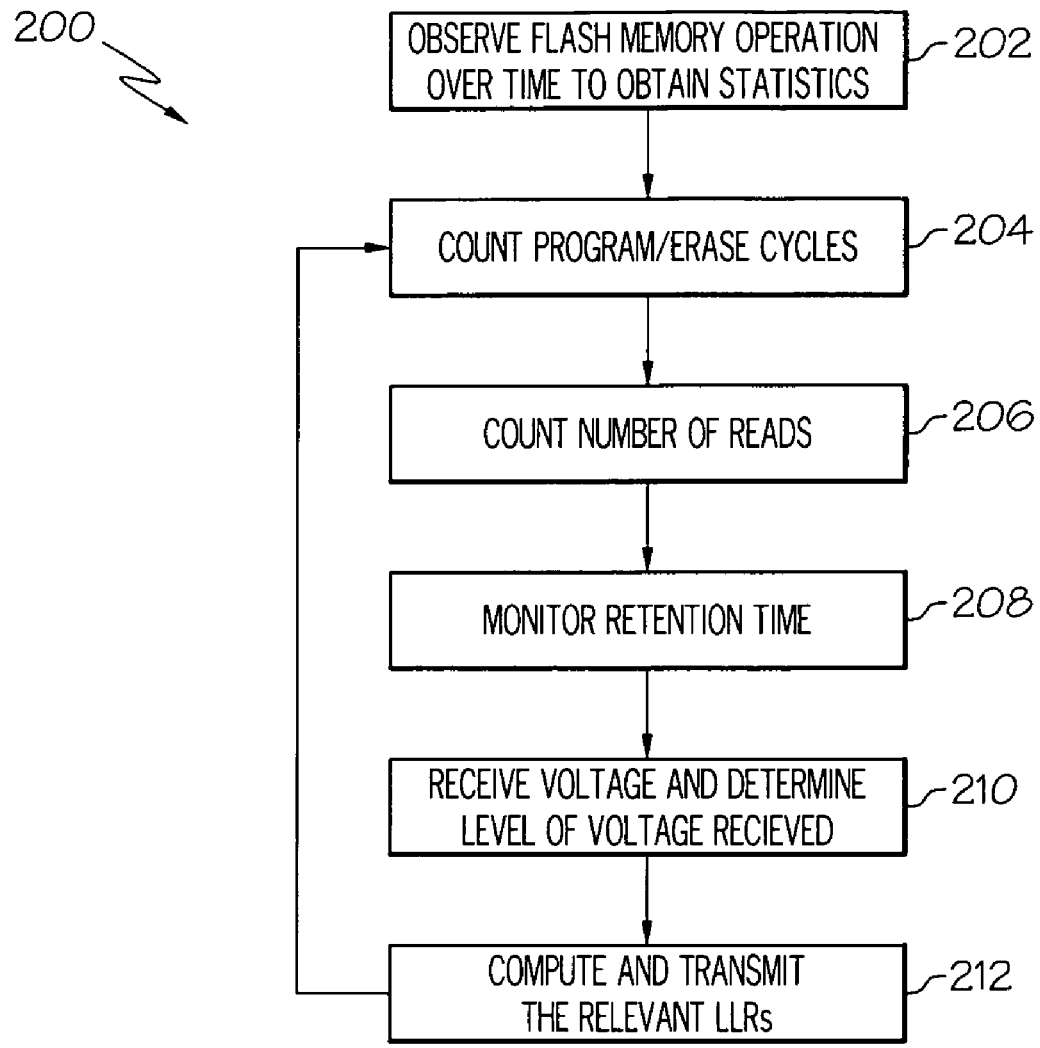
FIG. 2 depicts a flow chart of an embodiment for calculating and using Log Likelihood Ratios.

FIG. 2 shows a flow chart 200 of an embodiment for computing and using LLRs based on a priori knowledge of the write, retention, and read statistics of the memory. This a priori knowledge is obtained by observing flash memory operation over many intervals of time (element 202). Thus, for example, errors observed during may writes, retentions, and reads are used to obtain the terms that make up the LLR. The terms W,X,Y,Z,β, δ,α,γ, or the terms involving these terms, may thus be computed in advance for each of a different set of the conditions (e.g., cycles, nreads, retention time). Thus, terms that make up the LLRs, or the LLRs themselves, can be computed in advanced and stored in memory to be recalled as needed. This allows for use of soft coding such as LDPC coding.

During memory operations, the system monitors the conditions of operation. Thus, the system will count program/erase cycles (element 204), will count the number of reads (element 206), and monitor the retention time (element 208). This information may be used to look up the correct LLR (or its terms) from memory. When the system must execute a read operation, the LLR calculator received the read voltage and determines the level of the voltage received (element 210). Based on the determined level, the relevant LLRs are computed (or looked up in memory). These LLRs are then transmitted to the decoder (element 212).

Thus, one embodiment comprises a method for determining data of a multi-level cell flash memory. The method comprises reading a cell of the memory to determine a voltage level of the cell. The method further comprises determining a soft value of each bit of a group of bits corresponding to the level; wherein a soft value is determined from a priori information about the memory. The method also comprises decoding the soft values to determine read values of the data.

In one embodiment, decoding the soft values is performed by a (Low Density Parity Check) LDPC decoding algorithm. In some embodiments, determining a soft value of each bit of a group of bits corresponding to the level comprises determining a soft value of a most significant bit in the group and determining a soft value of a least significant bit in the group. In some embodiments, a flash memory cell is a four level cell. In some embodiments, a soft value of a bit is a logarithmic function of transition probabilities. The transition probabilities may be determined from observations of flash memory operations over time. A soft value of a bit may depend upon a number of program/erase cycles of the memory, a number of read operations performed on the memory, and upon a memory retention time.

Thus, embodiments comprise a method for enabling the use of soft coding by determining LLRs that can be used by a soft decoder such as an LDPC decoder. The LLRs that are output to the decoder depend upon the level of the voltage of the cell, as well as the statistics of the memory. These statistics are based on observations of the behavior of a flash memory over time. Embodiments therefore provide improved memory performance (i.e., less errors) because an optimal soft coding can be employed.

The present invention and some of its advantages have been described in detail for some embodiments. It should be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A method for determining data of a multi-level cell flash memory, comprising:
   reading a cell of the memory to determine a voltage level of the cell;
   determining a soft value of each bit of a group of bits corresponding to the level;
   wherein a soft value is determined from a priori information about the memory, wherein the soft value of each bit is calculated by a Log-Likelihood Ratio (LLR) calculator and is a logarithmic function of transition probabilities calculated from observations of flash memory operations over time, wherein the observations comprise a number of program/erase cycles of the memory; and decoding the soft values to determine read values of the data.

2. The method of claim 1, wherein decoding the soft values is performed by a (Low Density Parity Check) LDPC decoding algorithm.

3. The method of claim 1, wherein determining the soft value of each bit of the group of bits corresponding to the level comprises determining a soft value of a most significant bit in the group and determining a soft value of a least significant bit in the group.

4. The method of claim 1, wherein a flash memory cell is a four level cell.

5. The method of claim 1, wherein determining the soft value of each bit depends a number of read operations performed on the memory.

6. The method of claim 1, wherein determining the soft value of each bit depends upon a memory retention time.

7. A multi-level cell flash memory system for writing, storing and reading data, comprising:

an encoder to encode data received for writing to a flash memory;

the flash memory to receive data from the encoder and to store data and to make data available to be read by an external device, wherein a cell of the flash memory outputs a voltage level that is interpreted by a Log-Likelihood Ratio (LLR) calculator to be the closest one of four voltage levels of the cell;

the Log-Likelihood Ratio (LLR) calculator to output a calculated LLR value of each bit of the most and least significant bits corresponding to the interpreted voltage level, wherein the LLR value of each bit is a logarithmic function of transition probabilities calculated from observations of flash memory operations over time, wherein the observations comprise a number of program/erase cycles of the flash memory; and a decoder to decode the LLR values received from the calculator to determine read values of the memory system.

8. The system of claim 7, wherein the encoder and decoder implement Low Density Parity Check (LDPC) coding.

9. The system of claim 7, wherein the LLR calculator outputs LLR values based on the interpreted level.

10. The system of claim 7, wherein the LLR calculator outputs LLR values based on a number of read operations of the memory.

11. The system of claim 7, wherein the LLR calculator outputs LLR values based on a retention time of the data.

* * * * *

UNITED STATES PATENT AND TRADEMARK OFFICE
CERTIFICATE OF CORRECTION

| | |
|---|---|
| PATENT NO. | : 7,656,707 B2 |
| APPLICATION NO. | : 12/002020 |
| DATED | : February 2, 2010 |
| INVENTOR(S) | : Alexander Kozlov |

It is certified that error appears in the above-identified patent and that said Letters Patent is hereby corrected as shown below:

In column 7, line 20, in Claim 5, delete "depends a" and insert -- depends upon a --, therefor.

Signed and Sealed this

Sixth Day of April, 2010

David J. Kappos
*Director of the United States Patent and Trademark Office*